United States Patent
Pfirsch et al.

(10) Patent No.: US 8,637,328 B2
(45) Date of Patent: Jan. 28, 2014

(54) INTEGRATED CIRCUIT HAVING DOPED SEMICONDUCTOR BODY AND METHOD

(75) Inventors: Frank Pfirsch, Munich (DE); Hans-Joachim Schulze, Taufkirchen (DE); Franz-Josef Niedernostheide, Muenster (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/564,158

(22) Filed: Aug. 1, 2012

(65) Prior Publication Data

US 2012/0313225 A1 Dec. 13, 2012

Related U.S. Application Data

(63) Continuation of application No. 11/944,903, filed on Nov. 26, 2007, now Pat. No. 8,236,676.

(30) Foreign Application Priority Data

Nov. 27, 2006 (DE) .......................... 10 2006 055 885

(51) Int. Cl.
*H01L 21/66* (2006.01)
*H01L 29/36* (2006.01)

(52) U.S. Cl.
USPC ............................................ 438/17; 257/655

(58) Field of Classification Search
CPC ................................ H01L 29/36; H01L 21/66
USPC .............. 257/655, E21.531, E29.109; 438/17
See application file for complete search history.

(56) References Cited

U.S. PATENT DOCUMENTS

| | | | |
|---|---|---|---|
| 4,805,004 A | 2/1989 | Gandolfi et al. | |
| 5,528,058 A | 6/1996 | Pike et al. | |
| 6,043,516 A | 3/2000 | Schulze | |
| 7,358,127 B2 | 4/2008 | Nemoto | |
| 7,485,550 B2 | 2/2009 | Mauder et al. | |
| 2006/0030126 A1 | 2/2006 | Mauder et al. | |
| 2006/0043470 A1 | 3/2006 | Schulze et al. | |

FOREIGN PATENT DOCUMENTS

| | | | |
|---|---|---|---|
| DE | 10240107 | | 3/2004 |
| DE | 10245 091 | * | 4/2004 |
| DE | 10 2004 005 775 | * | 8/2005 |
| DE | 102004030573 | | 1/2006 |
| DE | 102005021302 | | 11/2006 |

OTHER PUBLICATIONS

Schulze, H. -J; Niedernostheide, F. -J; Kellner-Werdehausen, U., "Thyristor with integrated forward recovery protection function," Power Semiconductor Devices and ICs, 2001. ISPSD '01. Proceedings of the 13th International Symposium on , vol., no., pp. 199-202, 2001.*

(Continued)

*Primary Examiner* — Walter H Swanson
(74) *Attorney, Agent, or Firm* — Dicke, Billig & Czaja, PLLC

(57) ABSTRACT

An integrated circuit and method for making an integrated circuit including doping a semiconductor body is disclosed. One embodiment provides defect-correlated donors and/or acceptors. The defects required for this are produced by electron irradiation of the semiconductor body. Form defect-correlated donors and/or acceptors with elements or element compounds are introduced into the semiconductor body.

13 Claims, 5 Drawing Sheets

(56) References Cited

OTHER PUBLICATIONS

S.J. Taylor et al., "Investigation of carrier removal in electron irradiated silicon diodes" J. Appl. Phys. 82 (7), 3239-3249, Oct. 1, 1997.
Non-Final Office Action mailed Apr. 30, 2009 in U.S. Appl. No. 11/944,903.
Final Office Action mailed Nov. 24, 2009 in U.S. Appl. No. 11/944,903.
Non-Final Office Action mailed Sep. 7, 2011 in U.S. Appl. No. 11/944,903.

* cited by examiner ically claims priority to German Patent Application
INTEGRATED CIRCUIT HAVING DOPED SEMICONDUCTOR BODY AND METHOD

CROSS-REFERENCE TO RELATED APPLICATIONS

This Utility Patent Application is a continuation application of U.S. application Ser. No. 11/944,903, filed Nov. 26, 2007, which claims priority to German Patent Application No. DE 10 2006 055 885.5 filed on Nov. 27, 2006, which both are incorporated herein by reference.

BACKGROUND

One or more embodiments relate to a method for making an integrated circuit including doping a semiconductor body and an integrated circuit having a doped semiconductor body.

By doping a semiconductor body, semiconductor zones of different conductivity types, i.e. pn junctions, can be formed therein. A multiplicity of semiconductor components such as MOSFETs (Metal Oxide Semiconductor Field Effect Transistors), bipolar transistors, IGBTs (Insulated Gate Bipolar Transistors), thyristors or else diodes can thus be realized. For semiconductor components having reverse voltages in the range of a few 100 V to a few kV or a few 10 kV, on the one hand low dopant concentrations of the starting material are desirable, but on the other hand they should also be realized with suitable homogeneity in order to obtain specified reliability of the respective semiconductor component or else a required yield during the production of the respective semiconductor component of the integrated circuit. Therefore, a method for doping a semiconductor body which enables favorable properties with regard to the homogeneity of a dopant concentration obtainable thereby is desirable.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1A:
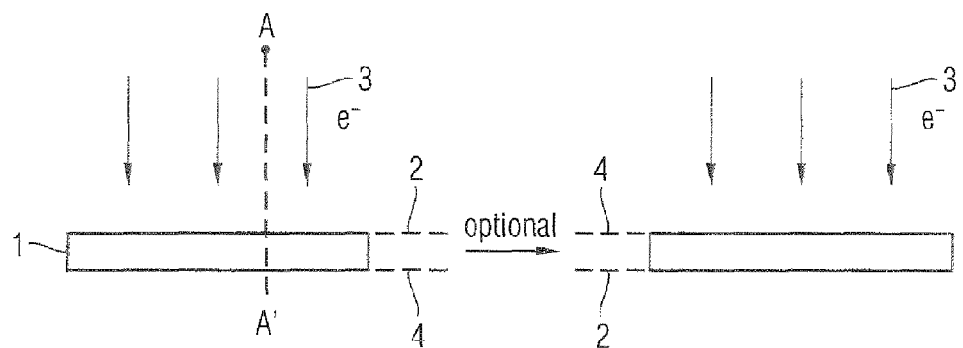
FIG. 1A to 1C illustrates schematic cross-sectional views during a process stage in accordance with embodiments for making an integrated circuit including doping a semiconductor body.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides a method for making an integrated circuit including doping a semiconductor body including irradiation of the semiconductor body with electrons in order to produce defects therein, introduction of an element or element compound forming defect-correlated donors and/or acceptors into the semiconductor body and activation of the defect-correlated donors and/or acceptors.

The semiconductor body can be a semiconductor wafer, for example. The wafer may already have been subjected to further processes, e.g., in the context of forming a semiconductor component, before the irradiation with electrons. The irradiation of the semiconductor body with electrons is effected for example in such a way that the defects generated thereby are distributed as homogenously as possible in the semiconductor body. For this purpose, for instance the energy of the electron beam can be coordinated with the range dependant on the material of the semiconductor body. The defects produced in the semiconductor body can be for instance vacancies, e.g., vacancies in a silicon lattice. The vacancies can form vacancy complexes or else complexes with other defects present in the semiconductor wafer. In this case, an irradiation of the semiconductor body with electrons can be effected over one surface of the semiconductor body or else sequentially over opposite surfaces of the semiconductor body. Through a suitable choice of electron dose and electron energy, it is possible to obtain an advantageous vertical homogeneity of the defects required for forming the defect-correlated donors and/or acceptors.

In one embodiment, the activation of the defect-correlated donors and/or acceptors is effected during the introduction of the element or element compound forming defect-correlated donors and/or acceptors by the semiconductor body being heated.

In a further embodiment, the activation of the defect-correlated donors and/or acceptors is effected using a process of thermal annealing of the semiconductor body subsequent to the introduction of the element or element compound.

In a further embodiment, the irradiation of the semiconductor body with electrons is effected before the introduction of the element or element compound forming defect-correlated donors and/or acceptors. This embodiment then affords advantages for example if the introduction of the elements or element compounds forming defect-correlated donors and/or acceptors can be effected more homogenously in the case where defects are already present in the semiconductor body, e.g., using an intensified diffusion on account of the defects.

In a further embodiment, the irradiation of the semiconductor body with electrons is effected after the introduction of the element or element compound forming defect-correlated donors and/or acceptors. Such an embodiment then affords advantages for example if the elements or element compounds forming the defect-correlated donors and/or acceptors diffuse to a greater extent in a low-defect semiconductor body than in a defect-rich semiconductor body, since an advantageous homogeneity of the elements or element compounds in the semiconductor body can then be obtained. If hydrogen, for example, is chosen for forming hydrogen-correlated donors in a silicon lattice to which vacancies have been added, then it is possible, when the hydrogen is introduced into the silicon lattice with a subsequent irradiation of the silicon crystal with electrons, to obtain a faster distribution of the hydrogen in the silicon since atomic hydrogen diffuses more rapidly in low-defect silicon than in defect-rich silicon.

In a further embodiment, the introduction of the element or element compound forming defect-correlated donors and/or acceptors is effected by at least one of the methods plasma treatment, heat treatment and diffusion from a solid source. In the case of a plasma treatment, the element or the element compound is introduced into the semiconductor body via a plasma. In the case of the heat treatment, the element or the element compound is present in gaseous form in an atmosphere surrounding the semiconductor body and is introduced into the semiconductor body via the gas phase. In the case of diffusion from a solid source, a solid containing the element or element compound is applied to the semiconductor body and a diffusion of the element or element compound from the solid into the semiconductor body is effected using a thermal process.

In a further embodiment, an electron-shielding mask is applied to the semiconductor body before the irradiation with electrons in order to obtain a local irradiation. The defects can thereby be produced in a defined manner in specific regions of the semiconductor body. Consequently, it is possible to obtain for example a local doping by defect-correlated donors or acceptors in the semiconductor body.

In a further embodiment, after the introduction of an element or element compound forming defect-correlated donors and/or acceptors, a process of etching and cleaning of at least the surface over which the element or element compound was introduced is effected. It is thereby possible for example to remove defects at the surface of the semiconductor body which were produced during the introduction of the element or elements, e.g., plasma damage at the surface or the remaining solid source from which the element or element compound was introduced into the semiconductor body.

In a further embodiment, a temperature and/or duration during the thermal annealing of the semiconductor body are/is kept so low that defects produced in the semiconductor body remain for reducing a minority carrier lifetime. This embodiment thus enables a combined doping and setting of the minority carrier lifetime. Temperatures typical for this lie in the range of between 200° C. and 400° C.

In a further embodiment, the element introduced into the semiconductor body corresponds to at least one of the elements hydrogen and nitrogen. The semiconductor body can be for example a semiconductor body composed of silicon. Hydrogen forms defect-correlated donors in silicon, wherein the defects are produced as homogenously as possible for instance in the form of vacancies in the silicon lattice by electron irradiation of the semiconductor body given a suitable choice of the irradiation conditions.

In a further embodiment, a basic dopant concentration of the semiconductor body is chosen to be less than $5\times10^{14}$ cm$^{-3}$ and, in yet another embodiment, less than $1\times10^{14}$ cm$^{-3}$. The term basic dopant concentration herein denotes the dopant concentration of a semiconductor wafer into which doped semiconductor zones can be formed for the definition of semiconductor components in additional, for example previously performed processes. Such a low dopant concentration in silicon is suitable for example for forming components having high reverse voltages in the range of a few 100 V to a few 10 kV. In the case of such low dopant concentrations, a doping using defect-correlated donors and/or acceptors on the basis of the defects produced using electron irradiation enables a very homogenous dopant concentration. This has a favorable effect both on the reliability of the components produced thereby and on the process yield.

In accordance with a further embodiment, irradiation with electrons is effected with doses in the range of 0.1 to 500 kGy. The irradiation with electrons can be effected for example in an energy range of 4 MeV to 20 MeV. Although the dose range and energy range specified herein, for example for silicon as semiconductor body, afford suitable preconditions for doping with defect-correlated donors and/or acceptors, further semiconductor materials which deviate from Si and which have different absorption properties with regard to electron irradiation can adopt dose and energy ranges deviating therefrom.

In accordance with a further embodiment, the thermal annealing is effected at temperatures in the range of 220° C. to 550° C. over a time period in the range of 15 min to 20 h.

Besides silicon, the semiconductor body can for example also be formed from gallium arsenide. It goes without saying that materials deviating therefrom can also be used for the semiconductor body provided that defect-correlated donors and/or acceptors can be produced in the materials.

A further embodiment of a method for doping a semiconductor body composed of silicon including the features of irradiation of the semiconductor body with electrons in order to produce defects therein, introduction of hydrogen into the semiconductor body and activation of the defect-correlated donors and/or acceptors.

In one embodiment, the activation is effected during the introduction of the element or element compound forming the defect-correlated donors and/or acceptors or during a thermal annealing process in the semiconductor body.

A further embodiment relates to a method for making an integrated circuit including correcting a dopant concentration in a semiconductor body during the formation of an integrated circuit including the features of performing at least those processes for forming the integrated circuit which require a higher temperature in comparison with a temperature during the thermal annealing of the semiconductor body for forming the defect-correlated donors and/or acceptors, raising and/or lowering the net doping concentration in the semiconductor body using defect-correlated donors and/or acceptors, and completing the integrated circuit. It is thereby possible for example to raise a basic dopant concentration in the semiconductor body or else a dopant concentration within further semiconductor zones in the semiconductor body. By way of example, this may involve for instance a CoolMOS structure (superjunction or compensation component), in which, using an electron irradiation in conjunction with a hydrogen plasma treatment, it is possible to homogenously raise the dopant concentration of the n conductivity type within the n-conductive regions of the compensation structure and to reduce the effectively active dopant concentration of the p conductivity type in the p-conductive regions of the compensation structure. It is thereby possible for example to alter a loading in a targeted manner in the direction of a higher dopant concentration of the n conductivity type.

In accordance with a further embodiment, the correction of the dopant concentration can be carried out only in parts of the semiconductor body. For this purpose, for instance a mask impermeable to electrons can be applied to the semiconductor substrate, after which the semiconductor body can be irradiated with electrons in order to produce defects. The mask can be formed for example as a metal screen having a suitable thickness.

In a further embodiment, the correction of the dopant concentration is performed multiply in succession. Consequently, irradiation with electrons, introduction of elements or element compounds forming defect-correlated donors and/or acceptors, and a thermal annealing for forming the defect-correlated donors and/or acceptors are performed multiply in succession. Independently of the number of correction steps, that is to say also in the case of a single correction process, it is possible to determine a required additional dopant concentration and hence process parameters such as, for instance, the electron irradiation dose by characterizing measurements (e.g., a breakdown voltage measurement) on the components or test structures.

The integrated circuit can include, for example, a diode, a bipolar transistor, a MOS transistor, an IGBT or a thyristor. It goes without saying that structures deviating therefrom, such as diffusion resistors, for instance, can also be realized.

A further embodiment specifies an integrated circuit including semiconductor zones which are formed within a semiconductor body and define the integrated circuit, electrical connection/driving structures formed outside the semiconductor body, wherein a basic dopant concentration within the semiconductor body is determined by defect-correlated donors and/or acceptors. The semiconductor zones can be for example doped well zones with the aid of which e.g., source and drain of a MOS transistor, anode and cathode for a diode or else emitter, base and collector of a bipolar transistor are formed. The electrical connection/driving structures can be for instance metallization layers which are insulated from one another but which can be electrically connected, using vias, to one another and to a surface of the semiconductor body for making contact with the integrated circuit. Moreover, the connection/driving structures can also include gate insulation structures and gate electrodes in order for instance to control a channel conductivity of a MOS transistor. The basic dopant concentration within the semiconductor body can be for example the dopant concentration of a semiconductor component that defines the blocking strength and hence the voltage class of the component.

A further embodiment provides an integrated circuit including semiconductor zones which are formed within a semiconductor body and define the integrated circuit; electrical connection/driving structures formed outside the semiconductor body, wherein a dopant concentration within at least one of the semiconductor zones is determined by defect-correlated donors and/or acceptors.

A further embodiment relates to an integrated circuit including semiconductor zones which are formed within a semiconductor body composed of silicon and define the integrated circuit, electrical connection/driving structures formed outside the semiconductor body, wherein a basic dopant concentration of the n conductivity type within the semiconductor body is determined by hydrogen-correlated donors.

A further embodiment provides an integrated circuit including semiconductor zones which are formed within a semiconductor body composed of silicon and define the integrated circuit, electrical connection/driving structures formed outside the semiconductor body, wherein a dopant concentration within at least one of the semiconductor zones of the n conductivity type is determined by hydrogen-correlated donors.

In accordance with a further embodiment, a shortest connection—passing through the at least one of the semiconductor zones—between a front side and a rear side of the semiconductor body only runs through those further semiconductor zones which have a higher dopant concentration in comparison with the at least one of the semiconductor zones. If for example a cross-sectional view of the semiconductor body is considered, therefore, then further semiconductor zones lying above the at least one semiconductor zone and also below the latter have a comparatively higher dopant concentration with respect to the at least one of the semiconductor zones. The dopant concentration defined by the defect-correlated donors and/or acceptors in the at least one semiconductor zone therefore represents the lowest dopant concentration along such a connecting line from the front side to the rear side of the semiconductor body. The further semiconductor zones can represent for example semiconductor zones whose concentration profile of the dopants is determined by implantation or else diffusion from a solid source.

A further embodiment relates to an integrated circuit including semiconductor zones which are formed within a semiconductor body and define the integrated circuit, electrical connection/driving structures formed outside the semiconductor body, wherein at least one of the semiconductor zones contains a superjunction structure and a dopant concentration within the superjunction structure is at least partly determined by defect-correlated donors and/or acceptors.

The integrated circuit can include for example a diode, a bipolar transistor, a MOS transistor, a superjunction transistor, an IGBT or a thyristor.

Figure 1B:
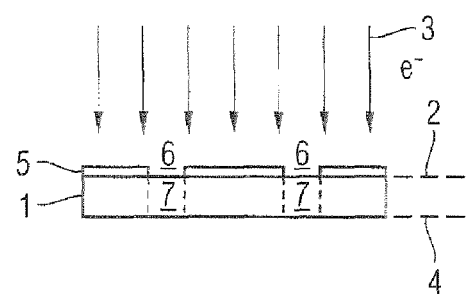
Figure 1C:
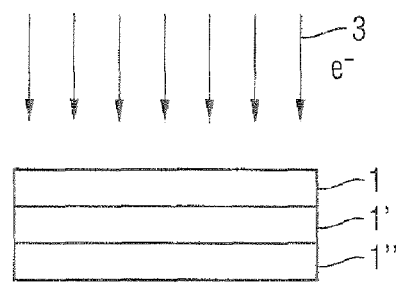

The views illustrated in the following figures serve for illustrating embodiments and are not represented in a manner true to scale. In the views, similar or corresponding elements are provided with the same reference identifications. The process stages illustrated in FIGS. 1A to 1C illustrate embodiments for irradiating a semiconductor body with electrons in order to produce defects in the semiconductor body. It should be pointed out that the embodiments for doping a semiconductor body are assigned not only the method feature for producing defects by electron irradiation as illustrated in FIGS. 1A to 1C but also further method features such as the introduction of an element or element compound forming defect-correlated donors and/or acceptors into the semiconductor body as well as a thermal annealing of the semiconductor body for forming the defect-correlated donors and/or acceptors. One or both of these further method features will be discussed for example in FIGS. 2A to 2C and the figure description thereof. It should be pointed out that the method features described with the aid of the figures of irradiation of the semiconductor body with electrons and also introduction of an element or element compound forming defect-correlated donors and/or acceptors can be performed in any desired order, that is to say that irradiation by electrons can thereby be effected after or before the introduction of the element or element compound forming defect-correlated donors and/or acceptors. Likewise, the method for doping the semiconductor body can be performed multiply in succession in order for example to gradually approach a desired dopant concentration more and more precisely.

FIG. 1A illustrates a schematic view during one process stage of a method for doping a semiconductor body in accordance with one embodiment. In this case, a semiconductor body 1, which may be for example a semiconductor wafer that has not yet been preprocessed or has already been preprocessed, is irradiated with electrons 3 over a surface 2 of the semiconductor body 1. This irradiation is intended to produce defects in the semiconductor body 1, with the aid of which defect-correlated donors and/or acceptors are formed in later process stages. In the irradiation an energy of the electrons 3 is chosen for example in such a way that defects having a defect concentration that is as homogenous as possible are thereby produced within the semiconductor body 1. The semiconductor body 1 can optionally be turned over after this irradiation, after which a renewed irradiation with electrons 3 may ensue. The electrons then firstly impinge on the surface 4, into the semiconductor body 1 and produce defects therein, after which the defects emerge from the semiconductor body 1 again via the surface 2. This optional renewed irradiation over the opposite surface can be used for example if an electron energy on which the irradiation is based would lead to a profile of the defect concentration from one surface to the other which, upon renewed irradiation from the opposite surface, has a favorable effect with regard to the homogeneity of the defect concentration that can thereby be obtained in the vertical wafer direction.

FIG. 1B illustrates a schematic illustration of a process stage of a method for doping a semiconductor body in accordance with a further embodiment. In this case, a mask 5 is applied on the semiconductor body 1 on the surface 2 before the irradiation with electrons 3, the material and thickness of the mask being chosen suitably in order to prevent the electrons 3 from penetrating into the semiconductor body 1. Consequently, during the irradiation of the surface 2, the electrons 3 penetrate into the semiconductor body 1 only in the regions 6 not covered by the mask 5.

Consequently, this embodiment enables a local irradiation of the semiconductor body 1 and hence a production of defects in selected regions 7 spaced apart laterally with respect to one another. It goes without saying that this electron irradiation can also be followed by a turning of the semiconductor body 1 with renewed electron irradiation from the opposite side.

FIG. 1C illustrates a schematic view of a process stage of a method for doping a semiconductor body in accordance with a further embodiment. In this case, a plurality of semiconductor bodies 1, 1' and 1" are stacked one above another. This is followed by irradiation with electrons 3 in order to produce the defects within the semiconductor bodies 1, 1' and 1". It should be pointed out that the number of semiconductor bodies stacked one above another need in no way amount to three, but rather can be chosen as desired taking account of a range that can be obtained with the chosen electron energy in the material of the semiconductor bodies 1, 1' and 1". The irradiation with electrons can likewise be performed repeatedly in succession, in which case a rearrangement of the stack sequence of the semiconductor bodies can ensue between the individual irradiations. Likewise, this embodiment can also be based on the use of a mask as illustrated in the process stage of FIG. 1B for obtaining a local irradiation with electrons.

Figure 2A:
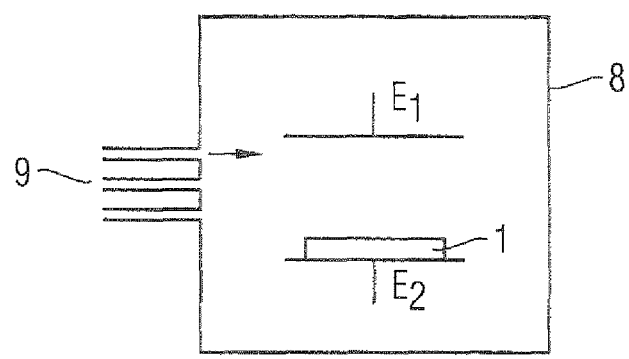
FIGS. 2A to 2C illustrate schematic cross-sectional views of a further process stage in accordance with embodiments for doping a semiconductor body.
Figure 2B:
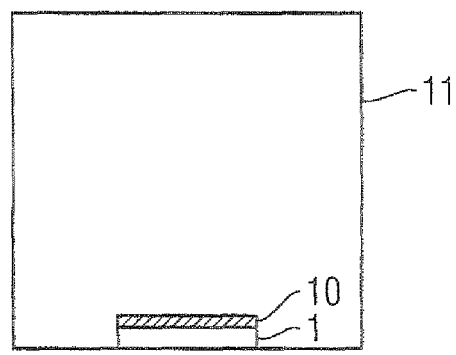
Figure 2C:
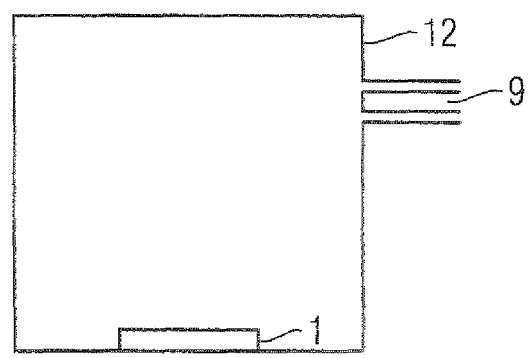

The process stages illustrated in FIGS. 2A to 2C serve for introducing an element or element compound forming defect-correlated donors and/or acceptors into the semiconductor body 1. It should be pointed out that this process stage can either precede or succeed the process stage for irradiating the semiconductor body with electrons as illustrated in FIGS. 1A to 1C. Optionally, the thermal annealing of the semiconductor body for forming the defect-correlated donors and/or acceptors can be carried out in the process chambers illustrated in FIGS. 2A to 2C. It is also possible to carry out the thermal annealing of the semiconductor body in a process chamber different from the process chamber for introducing the elements or element compounds.

FIG. 2A illustrates a schematic view of a process stage of a method for doping a semiconductor body in accordance with a further embodiment. The schematically illustrated process stage relates to the introduction of an element or element compound forming defect-correlated donors and/or acceptors into the semiconductor body 1. For this purpose, a plasma treatment is effected within a plasma chamber 8, into which the gases serving for igniting the plasma can be fed via a gas/vacuum system 9. In this case, the element or element compound forming the defect-correlated donors and/or acceptors is also passed initially in gaseous form, e.g., in a suitable gaseous compound, into the plasma chamber 8, where the element or element compound is liberated after the ignition of the plasma between two electrodes E1 and E2 and penetrates into the semiconductor body 1, which lies for instance on one of the electrodes E1, E2 serving as carrier. By way of example, it is possible to regulate the temperature in the plasma chamber 8, such that a thermal annealing of the semiconductor body 1 for forming the defect-correlated donors and/or acceptors can also be carried out within the plasma chamber. The plasma can be a hydrogen plasma, for example, which serves for introducing hydrogen into a semiconductor body composed of silicon in order to form hydrogen-correlated donors. The hydrogen plasma treatment takes place for example at temperatures of between 250° C. and 500° C. over a time period of 15 min to 150 min.

FIG. 2B illustrates a schematic view of a process stage of a method for doping a semiconductor body in accordance with a further embodiment. As already described in connection with FIG. 2A, this method feature also relates to the introduction of the element or element compound forming defect-correlated donors and/or acceptors into the semiconductor body 1. For this purpose, a solid source 10 containing the element or element compound to be introduced is applied to the semiconductor body 1. The semiconductor body 1 with the applied solid source 10 is subjected to a heat treatment, e.g., within a heating chamber 11, wherein the element or element compound contained in the solid source 10 escapes using this heat treatment and is introduced into the semiconductor body 1. Consequently, the solid source 10 is distinguished by the fact that the element or element compound which is contained in it and which is suitable for forming defect-correlated donors and/or acceptors escapes from the solid source during heating. In the case of a semiconductor body composed of silicon into which hydrogen is intended to be introduced, the solid source 10 used may be an amorphous silicon nitride layer, for example, which is deposited for instance using plasma enhanced chemical vapor deposition (PECVD) onto the semiconductor body 1 at temperatures of a few 100° C., e.g., 400° C. The silicon nitride deposited thereby has a very high hydrogen content, such that the hydrogen can be diffused from the silicon nitride layer into the silicon using a subsequent heat treatment process.

FIG. 2C illustrates a schematic view of a process stage of a method for doping a semiconductor body in accordance with a further embodiment. As already explained on the basis of the schematic views in FIGS. 2A and 2B, this process stage also relates to the introduction of an element or element compound forming defect-correlated donors and/or acceptors into the semiconductor body. In this case, the element or element compound is introduced using a heat treatment in a chamber 12, into which a gas containing the element or element compound in a suitable form is introduced via the gas/vacuum system 9, from where the element or element compound, in the case of a suitable temperature increase, penetrates into the semiconductor body 1 via a surface thereof. By way of example, hydrogen mixed with nitrogen gas, e.g., forming gas with a proportion of hydrogen of 20%, or nitrogen gas with an even higher proportion of hydrogen can be used for introducing hydrogen into the silicon.

Figure 3A:
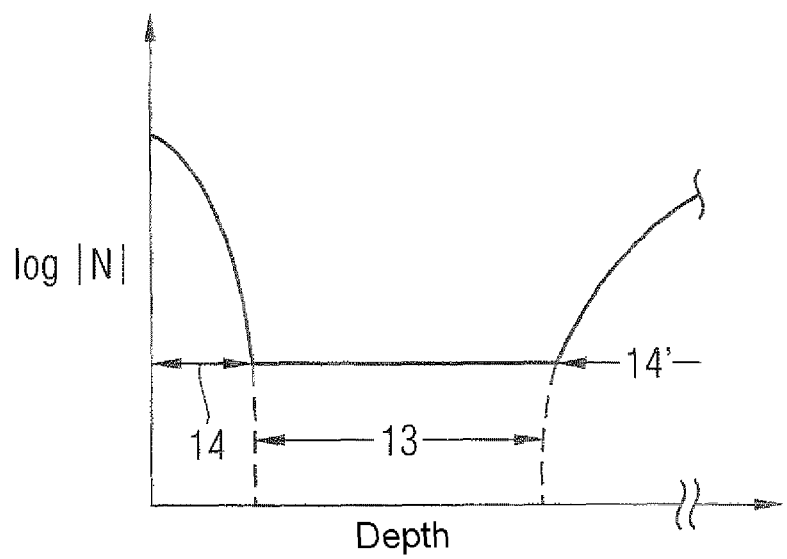
FIGS. 3A and 3B illustrate schematic dopant concentration profiles of a semiconductor body which can be obtained with embodiments of this invention.

FIG. 3A illustrates a schematic diagram of a profile of the dopant concentration N between opposite surfaces of a semiconductor body (i.e. into the depth) in accordance with one embodiment (e.g., along the sectional line A-A' from FIG. 1A). In this case, the dopant concentration N is homogenous in the region having the lowest dopant concentration 13. In the region 13, the dopant concentration N is defined by defect-correlated donors and/or acceptors which are formed for example on the basis of the process stages illustrated in FIGS. 1A-1C and 2A-2C. Further regions having a higher dopant concentration 14, 14' serve for example for defining a semiconductor component. The further regions having a higher dopant concentration can be produced for instance by ion implantation before the formation of the region 13. The regions 14, 13, 14' define for example body zone, drift zone and collector zone of a vertical MOS transistor.

Figure 3B:
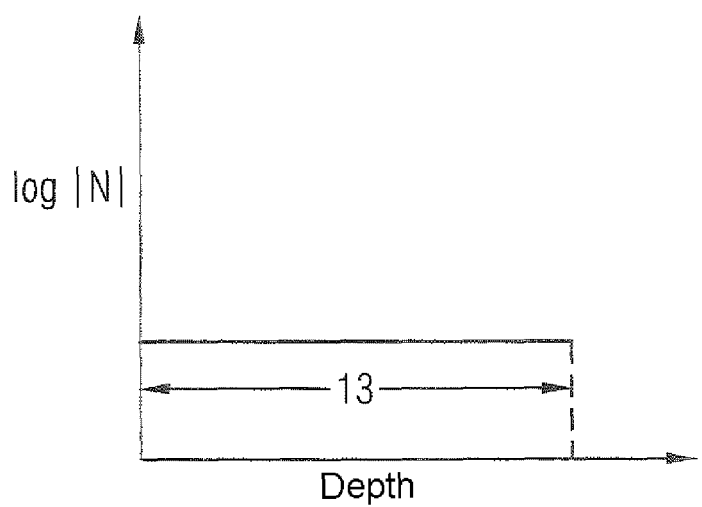

FIG. 3B illustrates a schematic diagram of a profile of the dopant concentration N between opposite surfaces of a semiconductor body in accordance with a further embodiment. In this case, the semiconductor body 1 has a homogenous dopant concentration N. The region having the lowest dopant concentration 13, which is formed using defect-correlated donors and/or acceptors, in this case includes the entire semiconductor body 1. In this embodiment, the doping using defect-correlated donors and/or acceptors is effected before the processing of the semiconductor body 1 for forming semiconductor components. This embodiment can be taken as a basis for example for a semiconductor process in which the processes for forming a component proceed at such low temperatures that the previously introduced defect-correlated donors and/or acceptors are not impaired inappropriately by the later processes, e.g., by dissociation. This embodiment may be suitable for instance for forming a Schottky diode.

Figure 4:
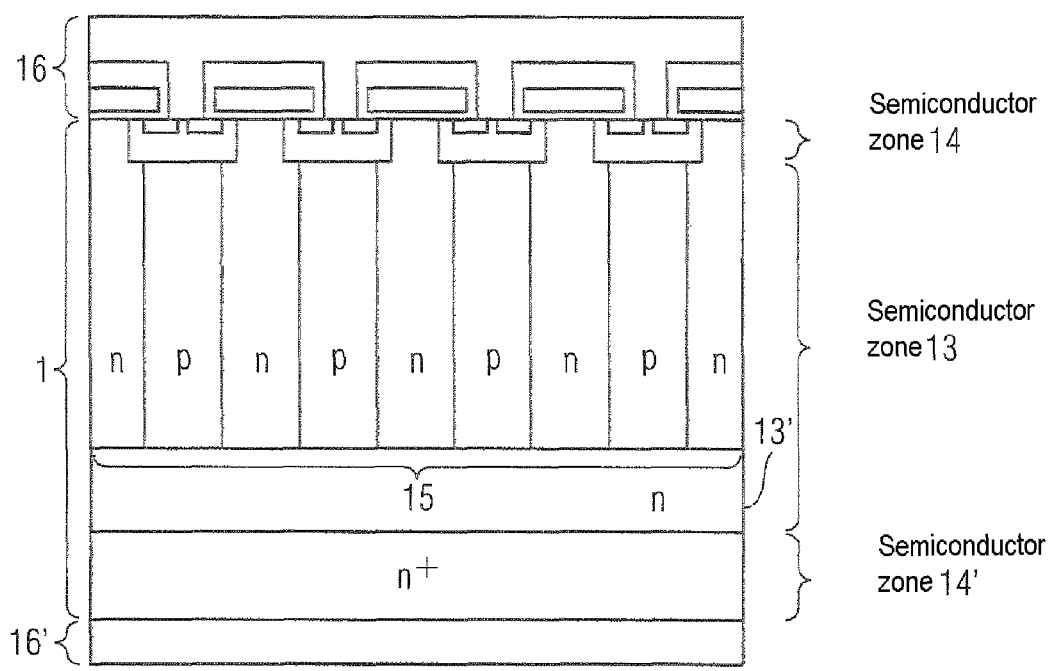
FIG. 4 illustrates a schematic cross-sectional view of a superjunction transistor structure.

FIG. 4 illustrates a schematic cross-sectional view of a superjunction transistor structure. Semiconductor zones 13, 14 and 14' are defined in a semiconductor body 1, wherein connection/driving structures 16, 16' make contact with the substrate from opposite surfaces. The connection/driving structure 16 includes for example metallization layers, contact plugs and also a gate electrode for controlling a channel conductivity in the semiconductor substrate (only outlined schematically in FIG. 4). The semiconductor zone 14 includes for example body and source regions (only outlined schematically in FIG. 4). A superjunction structure 15 in the form of laterally adjacent semiconductor regions having alternate conductivity types, i.e. n type and p type, is formed in the semiconductor zone 13. Moreover, between the superjunction structure 15 and the semiconductor zone 14' there may be arranged for example, only n-doped semiconductor zone 13' in the semiconductor zone 13. The semiconductor zone 14' has a comparatively higher dopant concentration in comparison with the semiconductor zone 13 and is formed between the semiconductor zone 13 and the rear-side connection/driving structure 16'. The superjunction structure 15 and the semiconductor zone 13' represent the region having the lowest dopant concentration, which region can be corrected with regard to the dopant concentration by defect-correlated donors and/or acceptors. If the superjunction transistor is formed from silicon, for example, and if hydrogen-correlated donors are used for correcting the dopant concentration of the superjunction structure, it is thereby possible to lower the net doping concentration of the p-doped regions of the superjunction structure 15 and to increase the net doping concentration of the n-doped semiconductor regions of the superjunction structure 15.

Figure 5:
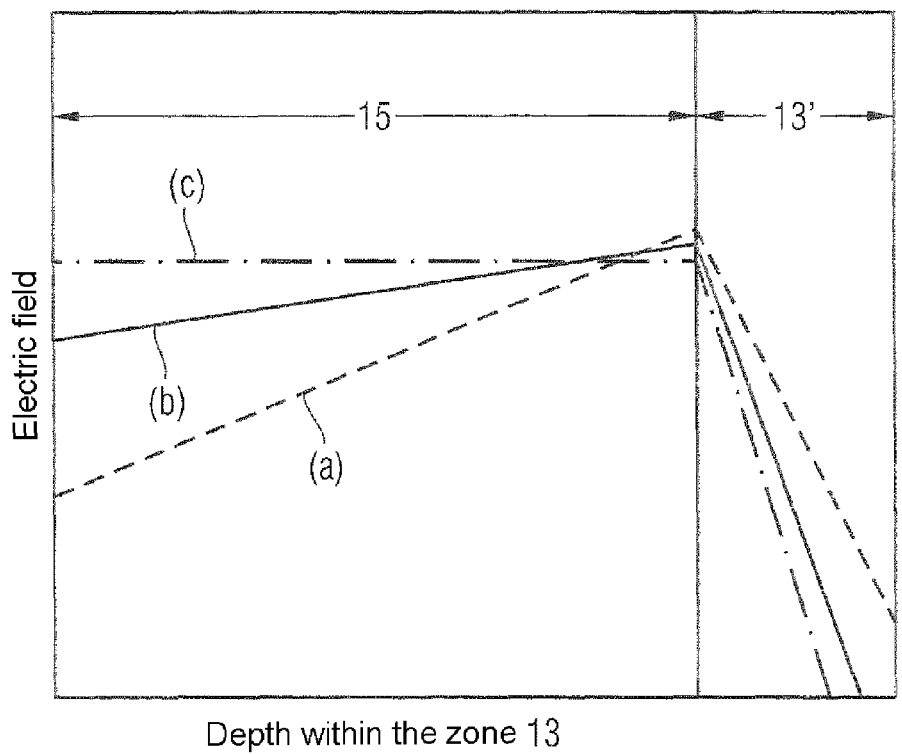
FIG. 5 illustrates schematic profiles of the electric field during the operation of the superjunction structure.

FIG. 5 illustrates by way of example a schematic illustration of the electric field against a depth of the superjunction structure 15 during operation. In this case, the electric field is illustrated from the semiconductor zone 14 through the semiconductor zone 13 to the semiconductor zone 14'. The rear-side reduction of the electric field takes place in the n-doped semiconductor zone 13' or else in the semiconductor zone 14'. An electric field profile before the correction by defect-correlated donors is illustrated as curved profile (a). A correction of the dopant concentration in the superjunction structure 15 by introduction of activation of the defect-correlated donors entails for example a change in the electric field profile as in the curved profiles (b) and (c). Depending on the correction dose, the profile of the electric field can be changed relative to the original field profile to a greater (cf. curve (c)) or less great (cf. curve (b)) extent. Such a correction of the electric field profile can be performed for example during or after the production of the superjunction transistor structure and be set in a suitable manner with the aid of supporting characterization techniques with regard to the electrical properties and also the reliability of the semiconductor component.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a semiconductor component, comprising:
    forming semiconductor zones within a semiconductor body that define at least part of the semiconductor component;
    forming electrical connection structures outside the semiconductor body; and
    forming a basic dopant concentration within the semiconductor body by defect-correlated donors and/or acceptors; and
    correcting the dopant concentration of the semiconductor body, wherein the correcting of the dopant concentration of the semiconductor body includes
    measuring a breakdown voltage of the semiconductor component or of a test structure; and
    determining an electron irradiation dose according to the breakdown voltage.

2. The method of claim 1, wherein the correcting the dopant concentration of the semiconductor body is performed multiple times in succession.

3. The method of claim 1, wherein the forming the basic dopant concentration includes
    irradiating the semiconductor body with electrons in order to produce defects therein;
    introducing an element or element compound forming defect-correlated donors and/or acceptors into the semiconductor body; and
    activating the defect-correlated donors and/or acceptors.

4. The method of claim 3, wherein the forming the basic dopant concentration is performed multiple times in succession.

5. The method of claim 3, further comprising applying an electron-shielding mask to the semiconductor body before the irradiating with electrons in order to obtain a local irradiation.

6. The method of claim 3, further comprising choosing a basic dopant concentration of the semiconductor body to be less than $5 \times 10^{14}$ cm-3.

7. A method of forming a semiconductor component, comprising:
   forming semiconductor zones within a semiconductor body that define the semiconductor component;
   forming electrical connection structures outside the semiconductor body; and wherein
   at least one of the semiconductor zones contains a superjunction structure and a dopant concentration within the superjunction structure is at least partly formed by defect-correlated donors and/or acceptors;
   the correcting dopant concentration within the superjunction structure, wherein correcting the dopant concentration within the superjunction structure includes;
   measuring a breakdown voltage of the semiconductor component or of a test structure; and
   determining an electron irradiation dose according to the breakdown voltage.

8. The method of claim 7, wherein the correcting dopant concentration within the superjunction structure is performed multiple times in succession.

9. The method of claim 7, wherein the forming the dopant concentration within the superjunction structure includes
   irradiating the semiconductor body with electrons in order to produce defects therein;
   introducing an element or element compound forming defect-correlated donors and/or acceptors into the semiconductor body; and
   activating the defect-correlated donors and/or acceptors.

10. The method of claim 9, wherein the forming the dopant concentration within the superjunction structure is performed multiple times in succession.

11. The method of claim 9, further comprising applying an electron-shielding mask to the semiconductor body before the irradiating with electrons in order to obtain a local irradiation.

12. The method of claim 9, further comprising choosing a basic dopant concentration of the semiconductor body to be less than $5 \times 10^{14}$ cm-3.

13. The method of claim 9, further comprising using an electron irradiation in conjunction with a hydrogen plasma treatment to homogenously raise a dopant concentration of an n-conductivity type within n-conductive regions of a compensation structure and to reduce an effectively active dopant concentration of a p-conductivity type in p-conductive regions of the compensation structure.

* * * * *